US012696436B2

(12) United States Patent
Yin et al.

(10) Patent No.: US 12,696,436 B2
(45) Date of Patent: Jul. 28, 2026

(54) THREE-DIMENSIONAL STATIC RANDOM-ACCESS MEMORY AND PREPARATION METHOD THEREFOR

(71) Applicant: INSTITUTE OF MICROELECTRONICS, CHINESE ACADEMY OF SCIENCES, Beijing (CN)

(72) Inventors: Huaxiang Yin, Beijing (CN); Xiang Lin, Beijing (CN); Yanna Luo, Beijing (CN); Zhanfeng Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 969 days.

(21) Appl. No.: 17/779,723

(22) PCT Filed: Dec. 10, 2019

(86) PCT No.: PCT/CN2019/124212
§ 371 (c)(1),
(2) Date: May 25, 2022

(87) PCT Pub. No.: WO2021/103131
PCT Pub. Date: Jun. 3, 2021

(65) Prior Publication Data
US 2023/0005937 A1 Jan. 5, 2023

(30) Foreign Application Priority Data

Nov. 26, 2019 (CN) .......................... 201911174536.4

(51) Int. Cl.
*H10B 10/00* (2023.01)

(52) U.S. Cl.
CPC ........... *H10B 10/12* (2023.02); *H10B 10/125* (2023.02)

(58) Field of Classification Search
CPC ................. H10B 10/12; H10B 10/124; H01L 2924/1437; H10D 84/907; H10D 84/0165
See application file for complete search history.

(56) References Cited

U.S. PATENT DOCUMENTS

| | | | |
|---|---|---|---|
| 2009/0011575 | A1 | 1/2009 | Shimomura et al. |
| 2009/0078970 | A1 | 3/2009 | Yamazaki et al. |

(Continued)

FOREIGN PATENT DOCUMENTS

| | | |
|---|---|---|
| CN | 101339899 A | 1/2009 |
| CN | 104752431 A | 7/2015 |

(Continued)

OTHER PUBLICATIONS

PCT International Search Report in PCT/CN2019/124212.

(Continued)

*Primary Examiner* — Eva Y Montalvo
(74) *Attorney, Agent, or Firm* — Goodwin Procter LLP

(57) ABSTRACT

The method for manufacturing a three-dimensional static random-access memory, including: manufacturing a first semiconductor structure including multiple MOS transistors and a first insulating layer thereon; bonding a first material layer to the first insulating layer to form a first substrate layer; manufacturing multiple first low-temperature MOS transistors at a low temperature on the first substrate layer, and forming a second insulating layer thereon to form a second semiconductor structure; bonding a second material layer to the second insulating layer to form a second substrate layer; manufacturing multiple second low-temperature MOS transistors at a low temperature on the second substrate layer, and forming a third insulating layer thereon (Continued)

Manufacture a first semiconductor structure, where the first semiconductor structure includes multiple MOS transistors and a first insulating layer formed on the multiple MOS transistors — S1

Bond a first material layer to the first insulating layer, and perform first thinning and first surface processing on the first material layer to form a first substrate layer — S2

Manufacture multiple first low-temperature MOS transistors at a low temperature on the first substrate layer, and form a second insulating layer on the multiple first low-temperature MOS transistors to form a second semiconductor structure — S3

Bond a second material layer to the second insulating layer, and perform second thinning and second surface processing on the second material layer to form a second substrate layer — S4

Manufacture multiple second low-temperature MOS transistors at a low temperature on the second substrate layer, and form a third insulating layer on the multiple second low-temperature MOS transistors to form a third semiconductor structure — S5

Provide a through-hole within the first insulating layer, the second semiconductor structure, and the third semiconductor structure, and deposit metal in the through-hole to form an interconnection layer which interconnets the first semiconductor structure, the second semiconductor structure and the third semiconductor structure — S6 to form a third semiconductor structure; and forming an interconnection layer which interconnects the first semiconductor structure, the second semiconductor structure and the third semiconductor structure.

14 Claims, 8 Drawing Sheets

(56) References Cited

U.S. PATENT DOCUMENTS

| 2009/0185407 | A1 |   | 7/2009 | Park et al. |
| 2009/0224330 | A1 |   | 9/2009 | Hong et al. |
| 2010/0195375 | A1 |   | 8/2010 | Park et al. |
| 2011/0233617 | A1 | * | 9/2011 | Or-Bach ............... H01L 27/092 |
|   |   |   |   | 257/202 |
| 2012/0161126 | A1 | * | 6/2012 | Yamazaki ............. G11C 11/403 |
|   |   |   |   | 257/43 |
| 2015/0187763 | A1 |   | 7/2015 | Kim et al. |
| 2016/0276225 | A1 | * | 9/2016 | Kim .................. H01L 29/42364 |
| 2019/0051524 | A1 |   | 2/2019 | Guo et al. |
| 2020/0211910 | A1 |   | 7/2020 | Yin et al. |

FOREIGN PATENT DOCUMENTS

| CN | 107633997 | A | 1/2018 |
| CN | 109830463 | A | 5/2019 |
| IN | 101393919 | A | 3/2009 |

OTHER PUBLICATIONS

Research on Technologies and Applications of Low Temperature Wafer Bonding, Ph.D. Dissertation by Xiaohui Lin, Huazhong University of Science and Technology (Apr. 2008).

* cited by examiner

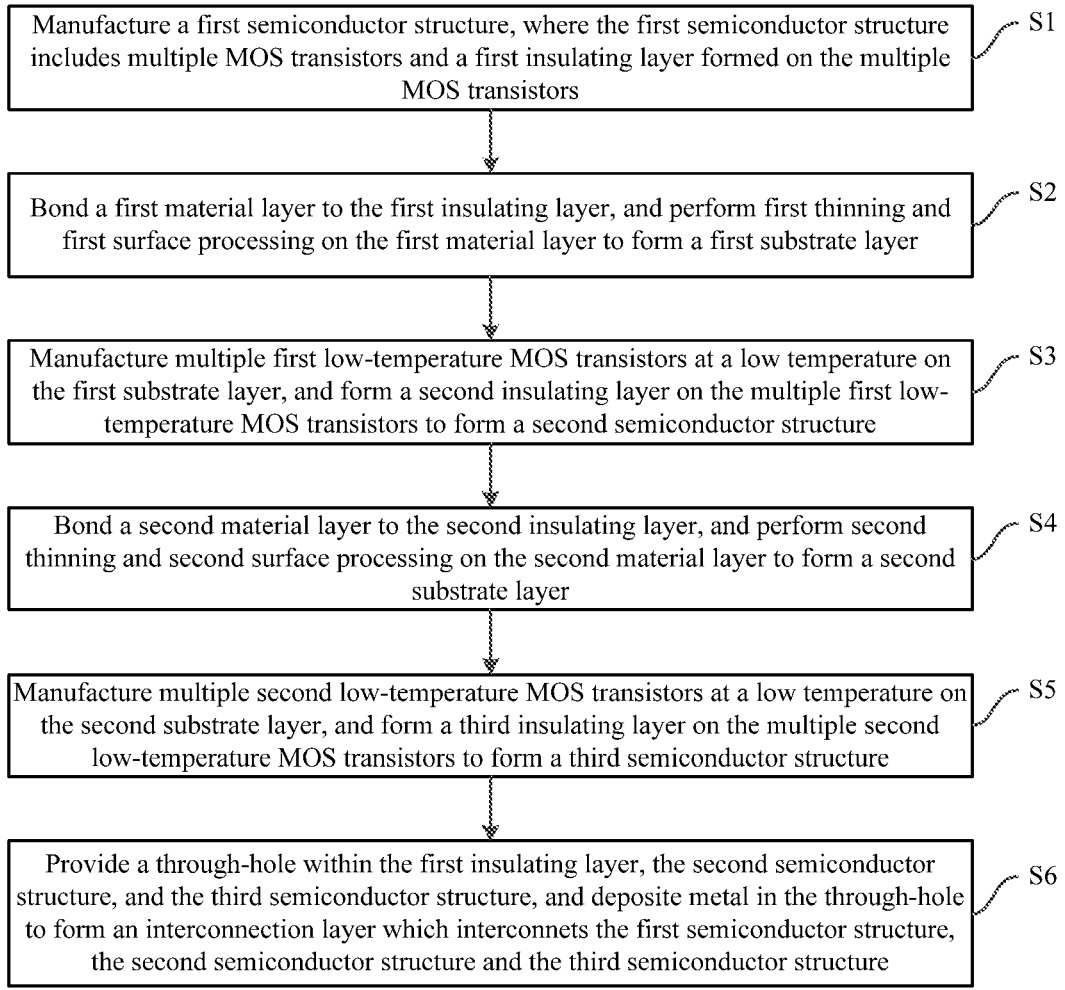

| | |
|---|---|
| Manufacture a first semiconductor structure, where the first semiconductor structure includes multiple MOS transistors and a first insulating layer formed on the multiple MOS transistors | S1 |
| Bond a first material layer to the first insulating layer, and perform first thinning and first surface processing on the first material layer to form a first substrate layer | S2 |
| Manufacture multiple first low-temperature MOS transistors at a low temperature on the first substrate layer, and form a second insulating layer on the multiple first low-temperature MOS transistors to form a second semiconductor structure | S3 |
| Bond a second material layer to the second insulating layer, and perform second thinning and second surface processing on the second material layer to form a second substrate layer | S4 |
| Manufacture multiple second low-temperature MOS transistors at a low temperature on the second substrate layer, and form a third insulating layer on the multiple second low-temperature MOS transistors to form a third semiconductor structure | S5 |
| Provide a through-hole within the first insulating layer, the second semiconductor structure, and the third semiconductor structure, and deposit metal in the through-hole to form an interconnection layer which interconnets the first semiconductor structure, the second semiconductor structure and the third semiconductor structure | S6 |

Figure 1

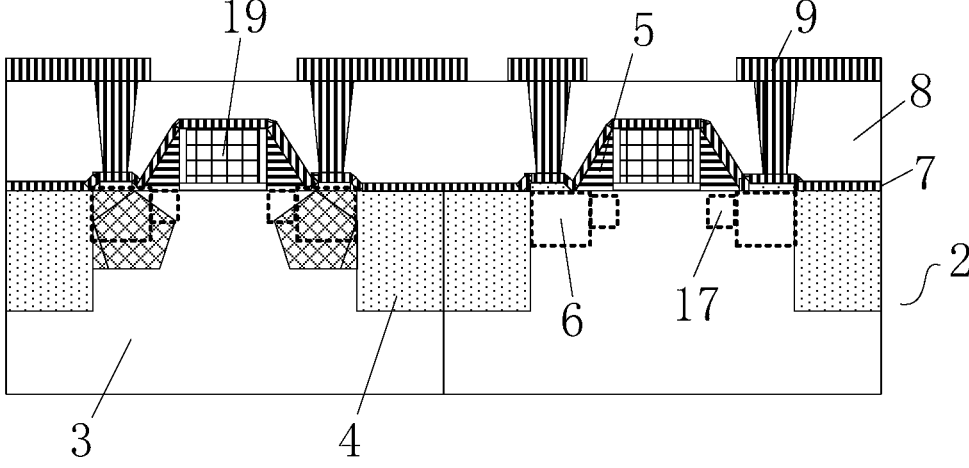

Figure 2

THREE-DIMENSIONAL STATIC RANDOM-ACCESS MEMORY AND PREPARATION METHOD THEREFOR

The present application is the national phase of International Application No. PCT/CN2019/124212, titled "THREE-DIMENSIONAL STATIC RANDOM-ACCESS MEMORY AND PREPARATION METHOD THEREFOR," filed on Dec. 10, 2019, which claims priority to Chinese Patent Application No. 201911174536.4, titled "THREE-DIMENSIONAL STATIC RANDOM-ACCESS MEMORY AND METHOD FOR MANUFACTURING THE SAME," filed on Nov. 26, 2019 with the China National Intellectual Property Administration. All the above-referenced related applications are incorporated herein by reference in their entireties.

FIELD

The present disclosure relates to the technical field of semiconductors, and in particular to a three-dimensional static random-access memory and a method for manufacturing the three-dimensional static random-access memory.

BACKGROUND

Continuous miniaturization of CMOS integrated circuits stimulates microsystem integration based thereon to evolve from three-dimensional packaging, system-level packaging, and multi-chip three-dimensional integration into single-chip three-dimensional integration. Thereby, a volume, a circuit delay, and circuit power consumption of microsystems keeps decreasing, and performances of microsystems are greatly improved.

Static random-access memories (SRAMs) are occupying more and more spaces on an integrated circuit, especially a CPU processor, which imposes higher requirements on continuous miniaturization of manufacture and continuous improvement of performances. The SRAMs are staked on a processing core by using through silicon vias (TSVs). Such solution is capable to reduce an area occupied by the SRAMs but results in issues such as poor performance, poor heat dissipation, and low integration.

In order to address the above issues, those skilled in the art may alter a manufacturing process and a structure of the SRAM units to make SRAM units "three dimensional", such that performances, efficiency, and an integration degree are improved in a CPU. The three-dimensional SRAM units may be implemented by fabricating multiple layers of vertical-channel field effect transistor through epitaxy, and depositing and crystallizing multiple layers of polycrystalline materials.

The above two means for implementing three-dimensional SRAM units concerns complex SRAM structures, immature manufacturing techniques, and/or deficient processing due to polycrystalline. Hence, there is no guarantee for quality of the manufactured three-dimensional SRAM, or the manufactured three-dimensional SRAM units are not three-dimensional.

SUMMARY

In conventional technology, SRAM units are prevented from being three-dimensional due to immature manufacturing techniques or deficient processing techniques. In order to address the above issue, a three-dimensional static random-access memory and a method for manufacturing the three-dimensional static random-access memory are provided according to embodiments of the present disclosure.

In an embodiment, the method for manufacturing a three-dimensional static random-access memory includes: manufacturing a first semiconductor structure, where the first semiconductor structure includes multiple MOS transistors and a first insulating layer formed on the multiple MOS transistors; bonding a first material layer to the first insulating layer, and performing first thinning and first surface processing on the first material layer to form a first substrate layer; manufacturing multiple first low-temperature MOS transistors at a low temperature on the first substrate layer, and forming a second insulating layer on the multiple first low-temperature MOS transistors to form a second semiconductor structure; bonding a second material layer to the second insulating layer, and performing second thinning and second surface processing on the second material layer to form a second substrate layer; manufacturing multiple second low-temperature MOS transistors at a low temperature on the second substrate layer, and forming a third insulating layer on the multiple second low-temperature MOS transistors to form a third semiconductor structure; and providing a through-hole within the first insulating layer, the second semiconductor structure and the third semiconductor structure, and depositing metal in the through-hole to form an interconnection layer which interconnets the first semiconductor structure, the second semiconductor structure and the third semiconductor structure.

In an embodiment, the multiple MOS transistors are CMOS transistors, and the first low-temperature MOS transistors and the second low-temperature MOS transistors are low-temperature CMOS transistors. Each of the first material layer and the second material layer is a monocrystalline silicon wafer, a monocrystalline germanium wafer, or a silicon-on-insulator (SOI) substrate.

In an embodiment, the first material layer is bonded to the first insulating layer through silicon-to-silicon direct bonding, metal surface bonding, polymer bonding, or eutectic bonding, and the second material layer is bonded to the second insulating layer through silicon-to-silicon direct bonding, metal surface bonding, polymer bonding, or eutectic bonding.

In an embodiment, bonding the first material layer to the first insulating layer through the silicon-to-silicon direct bonding process includes: planarizing and then rinsing a surface of the first insulating layer, where a monolayer of water molecules is retained on the surface of the first insulating layer after the rinsing; oxidizing a surface of the first material layer to form an oxidation surface; disposing the first material layer on the surface of the first insulating layer, at which the water molecules are retained, where the oxidation surface is in contact with the surface of the first insulating layer; bonding the oxidation surface to the surface of the first insulating layer at a low temperature in a face-to-face manner; and annealing the above-formed structure to implement bonding and interconnection between the first material layer with the first insulating layer.

In an embodiment, after forming the oxidation surface and before disposing the first material layer on the first insulating layer, the method further includes performing plasma activation on the oxidation surface and the surface of the first insulating layer.

In an embodiment, bonding the oxidation surface to the surface of the first insulating layer at the low temperature includes: applying a pressure mechanically on the surface of the first material layer.

In an embodiment, each of the first insulating layer, the second insulating layer, and the third insulating layer is made of $SiO_2$, $Si_3N_4$ or SiN, and has a thickness ranging from 300 nm to 3 μm.

In an embodiment, the multiple first low-temperature MOS transistors and the multiple second low-temperature MOS transistors are manufactured at a temperature T greater than 0° C. and lower than 500° C.

In an embodiment, manufacturing one of the multiple first low-temperature MOS transistors at the low temperature includes: forming an active region at a low temperature on the first substrate layer; manufacturing a sacrificial gate at a low temperature in the active region; forming, in the active region, source-or-drain extending regions at two sides of the sacrificial gate, and forming a spacer at a sidewall of the sacrificial gate; doping the active regions at the two sides of the sacrificial gate to form source-or-drain regions; depositing an oxide dielectric layer on the above-formed structure, and performing second planarization on the oxide dielectric layer to expose a top of the sacrificial gate; and performing gate-replacement, and forming multiple metal contacts for the one of the multiple first low-temperature MOS transistors.

In an embodiment, the source-or-drain regions are doped heavily with impurities or are fully siliconized metal.

In an embodiment, a three-dimensional static random-access memory is further provided. The three-dimensional static random-access memory includes a first semiconductor structure, a second semiconductor structure, a third semiconductor structure, and an interconnection layer. The first semiconductor structure includes multiple MOS transistors and a first insulating layer located on the multiple MOS transistors. The second semiconductor structure includes multiple first low-temperature MOS transistors and a second insulating layer located on the multiple first low-temperature MOS transistors. The third semiconductor structure includes multiple second low-temperature MOS transistors and a third insulating layer located on the multiple second low-temperature MOS transistors. The interconnection layer extends vertically within the first insulating layer, the second semiconductor structure, and the third semiconductor structure to interconnect the first semiconductor structure, the second semiconductor structure and the third semiconductor structure. The multiple first low-temperature MOS transistors are formed on the first insulating layer, and a substrate of the multiple first low-temperature MOS transistors is bonded to a side of the first insulating layer away from the MOS transistor. The multiple second low-temperature MOS transistors are formed on the second insulating layer, and a substrate of the multiple second low-temperature MOS transistors is bonded to a side of the second insulating layer away from the first low-temperature MOS transistor.

In an embodiment, the multiple MOS transistors are CMOS transistors. The multiple first low-temperature MOS transistors and the multiple second low-temperature MOS transistors are low-temperature CMOS transistors.

In an embodiment, each of the first insulating layer, the second insulating layer, and the third insulating layer is made of $SiO_2$, $Si_3N_4$ or SiN, and has a thickness ranging from 300 nm to 3 μm.

In summary, the method for manufacturing the three-dimensional static random-access memory is provided according to embodiments of the present disclosure. The multiple MOS transistors may be manufactured in a conventional manner, and the first insulating layer is formed on the multiple MOS transistors to form the first semiconductor structure. The first material layer is bonded to the first insulating layer to adhere the first insulating layer with the first material layer tightly. Then, the first material layer is subject to thinning and surface processing. The multiple first low-temperature MOS transistors are fabricated at the low temperature on the first material layer, and the second insulating layer is formed on the multiple first low-temperature MOS transistors to form the second semiconductor structure. The above operations of forming the second semiconductor structure are repeated to form the third semiconductor structure, and the interconnection layer is formed. Hence, manufacture of the three-dimensitonal SRAM is implemented.

In comparison with conventional technology, the method provided herein manufactures the three-dimensitonal SRAM combining a manner, which is conventional and mature for manufacturing MOS transistors or low-temperature MOS transistors, and bonding techniques. Thereby, an area occupied by SRAMs is reduced, quality of the SRAMs is guaranteed, and manufacture of the three-dimensitonal SRAM are less difficult.

Similarly, the three-dimensional SRAM according to embodiments of the present disclosure has the advantages of small occupation area, high quality, and simple structures.

BRIEF DESCRIPTION OF DRAWINGS

FIG. 1 is a flow chart of a method for manufacturing a three-dimensional static random-access memory according to an embodiment of the present disclosure; and FIGS. 2 to 15 are schematic structural diagrams of a three-dimensional static random-access memory manufactured during a method for manufacturing the three-dimensional static random-access memory according to an embodiment of the present disclosure.

| Reference signs: | | |
|---|---|---|
| 1 | first semiconductor structure; | 2 MOS transistor; |
| 3 | semiconductor substrate; | 4 shallow trench isolation; |
| 5 | spacer; | 6 source-or-drain region; |
| 7 | etching stop layer for contact holes; | 8 oxide dielectric layer; |
| 9 | metal contact; | 10 first insulating layer; |
| 11 | first material layer; | 12 first substrate layer; |
| 13 | second semiconductor structure; | 14 first low-temperature MOS transistor; |
| 15 | active region; | 16 sacrificial gate; |
| 17 | source-or-drain extending region; | 18 gate dielectric layer; |
| 19 | gate; | 20 second insulating layer; |
| 21 | third semiconductor structure; | 22 second low-temperature MOS transistor; |
| 23 | third insulating layer; | 24 interconnection layer; |
| 25 | oxidation surface. | |

DETAILED DESCRIPTION OF EMBODIMENTS

Hereinafter, specific embodiments of the present disclosure are described in conjunction with the drawings.

Various specific details are set forth in following description to facilitate a full understanding of the present disclosure. The present disclosure may be implemented in a manner different from those described herein. Therefore, the present disclosure is not limited by the specific embodiments disclosed hereinafter.

In conventional technology, SRAM units are prevented from being three-dimensional due to immature manufacturing techniques or deficient processing techniques. In order to address the above issue, a three-dimensional static random-access memory and a method for manufacturing the three-dimensional static random-access memory are provided according to embodiments of the present disclosure. The method provided herein manufactures the three-dimensitonal SRAM combining a manner, which is conventional and mature for manufacturing MOS transistors or low-temperature MOS transistors, and bonding techniques. Thereby, an area occupied by SRAMs is reduced, quality of the SRAMs is guaranteed, and manufacture of the three-dimensitonal SRAM are less difficult.

Reference is made to FIG. 1, which is a method for manufacturing a three-dimensional static random-access memory according to an embodiment of the present disclosure. The method includes following steps S1 to S6.

Figure 3:
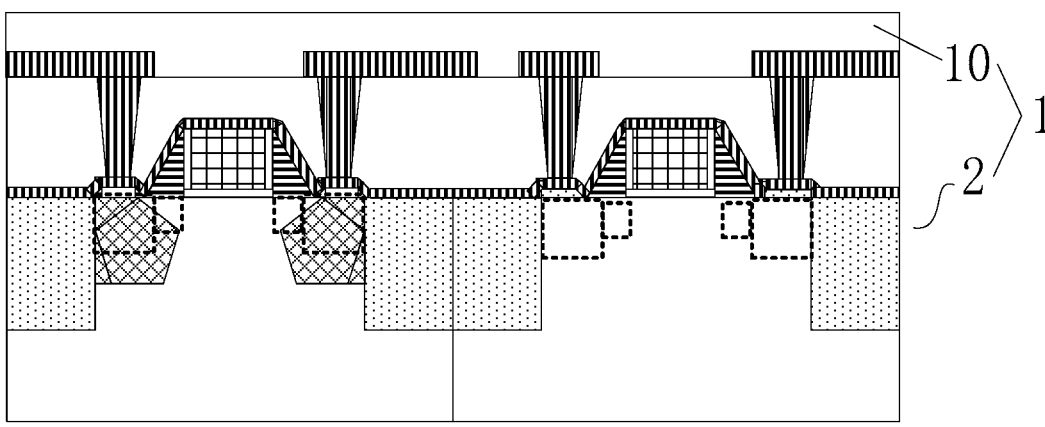

Reference is made to FIGS. 2 and 3. In step S1, a first semiconductor structure 1 is manufactured. The first semiconductor structure 1 includes multiple MOS transistors 2 and a first insulating layer 10 that is formed on the multiple MOS transistors 2.

In this step, the multiple MOS transistors 2 may be formed in a conventional manner, as shown in FIG. 2. The method for manufacturing the MOS transistor 2 may include following steps S11 to S15.

In step S1, a semiconductor substrate 3 is provided, and a shallow trench isolation 4 is formed in the semiconductor substrate 3.

In step S12, a sacrificial gate (not depicted) is formed on the semiconductor substrate 3, and a spacer 5 is formed on a sidewall of the sacrificial gate.

In step S13, a source-or-drain region 6 is formed on two sides of the sacrificial gate, an etching stop layer 7 for contact holes is deposited on the structure that has been formed, and then an oxide dielectric layer 8 is deposited on the structure that has been formed.

In step S14, the oxide dielectric layer 8 is planarized to expose a top of the sacrificial gate. Then, the sacrificial gate is replaced by a gate structure.

In step S15, the oxide dielectric layer 8 is etched downward from its top to expose the contact hole etching stop layer 7, and a metal contact 9 is formed.

In the step S1, the first insulating layer 10 is formed on the multiple MOS transistors 2 after the MOS transistors 2 are manufactured, as shown in FIG. 3. The first insulating layer 10 is made of $SiO_2$, $Si_3N_4$, or SiN, and has a thickness ranging from 300 nm to 3 μm.

In an embodiment, the MOS transistor 2 is a CMOS transistor. The semiconductor substrate 3 is a silicon substrate. Preferably, a thickness of the first insulating layer 10 ranges from 500 nm to 1.5 μm.

The first semiconductor structure 1 may be formed in various manners. The manner of forming the first semiconductor structure 1 may not be a main emphasis of the present disclosure. Therefore, the manner of forming the first semiconductor structure 1 is only briefly introduced herein to facilitate those skilled in the art carrying out the present disclosure. Those skilled in the art may manufacture the first semiconductor structure 1 in an alternative manner.

In step S2, a first material layer 11 is bonded to the first insulating layer 10, and then the first material layer 11 is subject to first thinning and first surface processing, so as to form a first substrate layer 12.

In this step, the first material layer 11 is bonded to the first insulating layer 10 through silicon-to-silicon direct bonding, metal surface bonding, polymer bonding, or eutectic bonding. The first material layer 11 may be made of a monocrystalline silicon wafer, a monocrystalline germanium wafer, or an SOI substrate. It is appreciated that the first material layer 11 may be made of any semiconductor material meeting an operation requirement.

In a case that the first material layer 11 is the monocrystalline silicon wafer or the SOI substrate, the first material layer 11 is bonded to the first insulating layer 10 through the silicon-to-silicon direct bonding which includes following steps S21 to S24.

In step S21, a surface of the first insulating layer 10 is subject to first planarization and rinsing, such that a monolayer of water molecules is retained on the surface of the first insulating layer 10.

In this step, after the first insulating layer 10 is deposited, the first insulating layer 10 is required to be planarized to ensure quality of the subsequent bonding. Thereby, an upper surface of the first insulating layer 10 is highly flat both globally and locally. After the first insulating layer 10 is subject to the first planarization, some particles may remain on the surface of the first insulating layer 10. Hence, the first insulating layer 10 should be rinsed to remove all the particles and retain a monolayer of water molecules on the upper surface of the first insulating layer 10.

In an embodiment, the first planarization is performed on the upper surface of the first insulating layer 10 through chemical mechanical polishing (CMP).

Figure 4:
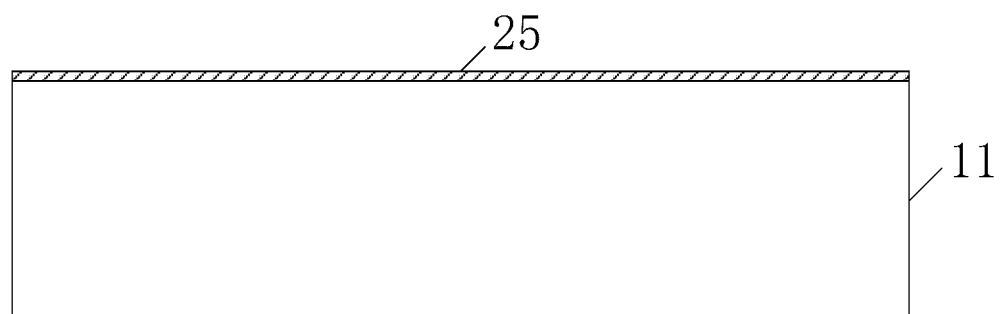

In step S22, a surface of the first material layer 11 is oxidized, so as to form an oxidation surface 25, as shown in FIG. 4.

In this step, before the silicon-to-silicon direct bonding, an upper surface of the first material layer 11 is required to be oxidized to form the oxidation surface 25 on the upper surface of the first material layer 11. A thickness of the oxidation surface 25 ranges from 1 nm to 500 nm.

Figure 5:
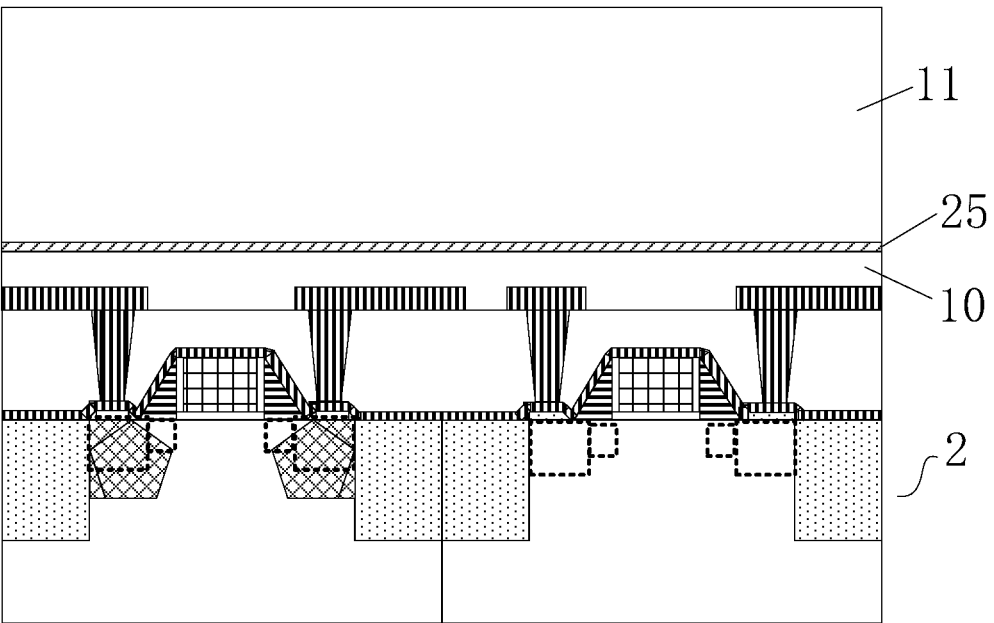

In step S23, the first material layer 11 is disposed, via the oxidation surface 25, on the surface of the first insulating layer 10 on which water molecules are retained, as shown in FIG. 5. The oxidation surface 25 is bonded to the surface of the first insulating layer 10 in a face-to-face manner at a low temperature.

In this step, the first material layer 11 is disposed, via the oxidation surface 25, on the surface of the first insulating layer 10 on which water molecules are retained. That is, the oxidation surface 25 of the first material layer 11 is in contact with the water molecules on the upper surface of the first insulating layer 10. In the bonding, the water molecules and oxygen atoms in the oxidation surface 25 form a hydrogen bond.

In step S24, the structure that has been formed is annealed to implement bonding and interconnection between the first material layer 11 and the first insulating layer 10.

In this step, the formed structure is annealed to convert the formed hydrogen bond into a Si—O bond. Compared with the hydrogen bond, the Si—O bond has a higher bonding strength, and hence can adhere the first insulating layer 10 tightly to the first material layer 11. Thereby, performances of the three-dimensional static random-access memory are improved.

Further, plasma activation is performed on the upper surface of the first material layer 11 and the upper surface of the first insulating layer 10, after the monolayer of water molecules is retained on the surface of the first insulating layer 10 and before the first material layer 11 is disposed on the surface of the first insulating layer 10, that is, after the step S21 and before the step S22. Thereby, impurity particles are removed from the upper surface of the first material layer 11 and the upper surface of the first insulating layer 10, improving an effect of the bonding.

Further, when of bonding the oxidation surface 25 of the first material layer 11 to the upper surface of the first insulating layer 10 at the low temperature, the surface of the first material layer 11 is under mechanical pressure to improve the effect of the bonding. The mechanical pressure ranges from 0 to 10 $kg/cm^2$.

Figure 6:
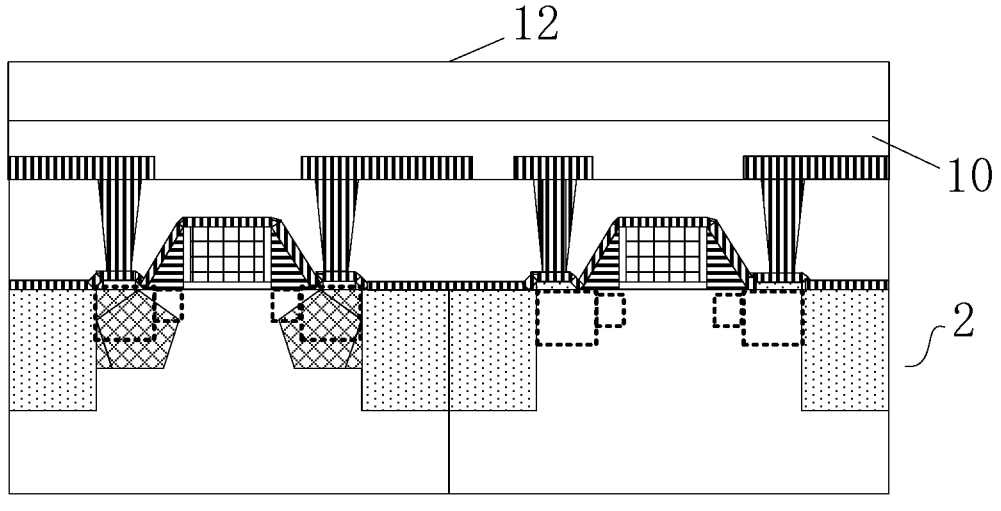

As shown in FIG. 6, a back side of the first material layer 11 away from the first insulating layer 10 should be subject to the first thinning and the first surface processing after the oxidation surface 25 is bonded to the upper surface of the first insulating layer 10, in order to form the first substrate layer 12. The first thinning includes rough grinding on the back side, fine grinding on the back side, and stress release. The rough grinding on the back side aims to reduce a thickness of the first material layer 11, and the fine grinding on the back side aims to make the back side of the first material layer 11 highly flat to facilitate subsequent steps of manufacturing. The stress release and the first surface processing may be performed through wet etching, CMP, or another process, so as to further improve quality of the back side of the first material layer 11, avoid physical damages on the back side, and reduce granularity.

In a case that the first material layer 11 is the SOI substrate, a buried oxygen layer in the SOI substrate may serve as a barrier for the first surface processing. In a case that the first material layer 11 is the monocrystalline silicon wafer, a rate of etching in the first surface processing is required to be controlled. Thereby, a thickness of the first material layer 11 is reduced to be less than 500 nm. Preferably, the thickness of the first material layer is reduced to a value ranging from 50 nm to 100 nm.

In step S3, multiple first low-temperature MOS transistors 14 are manufactured at a low temperature on the first substrate layer 12, and a second insulating layer 20 is formed on the multiple first low-temperature MOS transistors 14, so as to form a second semiconductor structure 13

In this step, the first low-temperature MOS transistors 14 may be low-temperature CMOS transistors.

In an embodiment, the first low-temperature MOS transistor 14 is manufactured at the low temperature through following steps S31 to S35.

Figure 7:
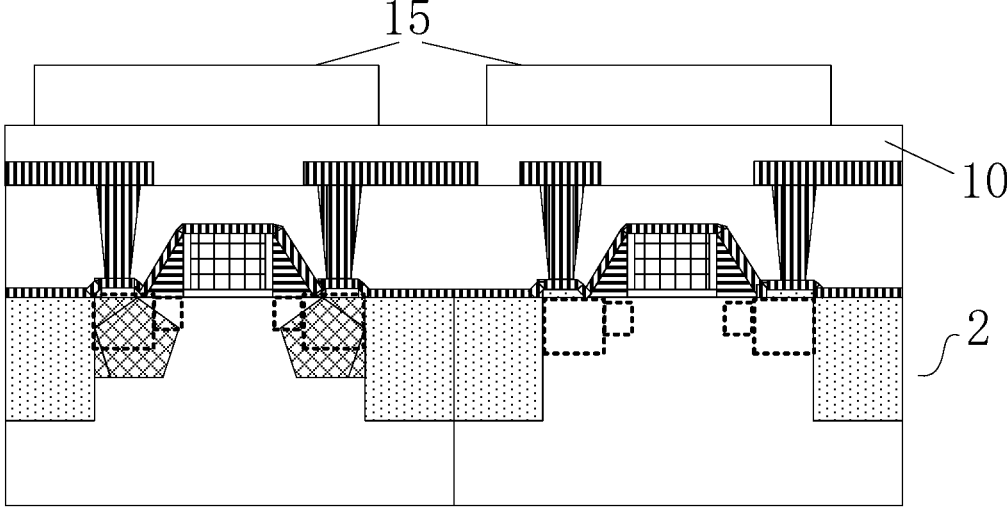

In step S31, an active region 15 is formed at a low temperature on the first substrate layer 12, as shown in FIG. 7.

Figure 8:
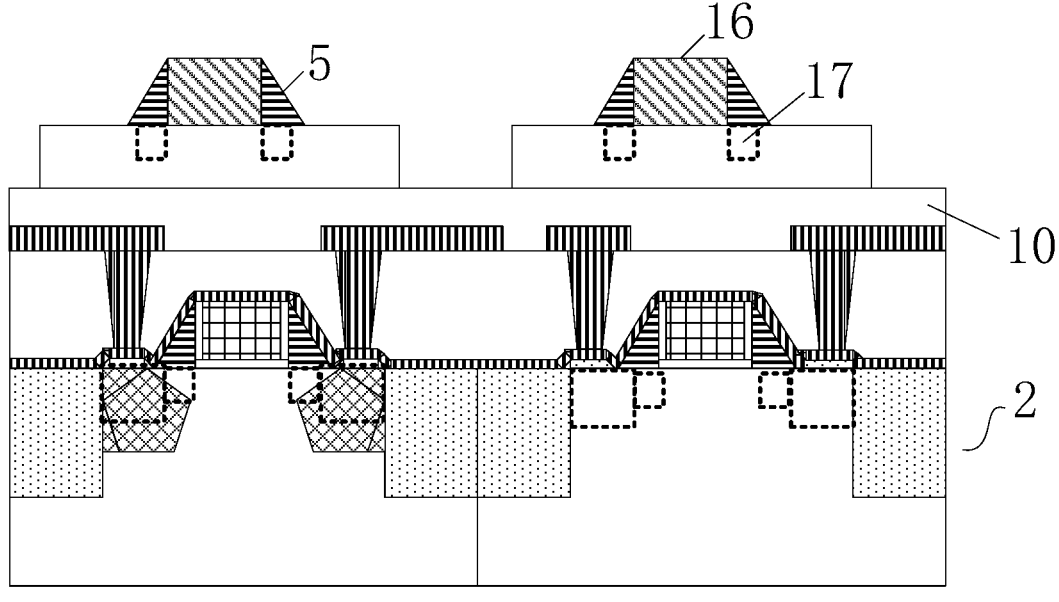

In step S32, a sacrificial gate 16 is formed at a low temperature on the active region 15, a source-or-drain extending region 17 is formed in the active region 15 on two sides of the sacrificial gate 16, and a spacer 5 is formed on a sidewall of the sacrificial gate 16. Reference is made to FIG. 8.

In this step, a gate material of the sacrificial gate 16 is deposited on the active region 15, and then the gate material is etched to form the sacrificial gate 16. After the sacrificial gate 16 is formed, the active region 15 on the two sides of the sacrificial gate 16 is doped to form the source-or-drain extending region 17. Further, a spacer material is deposited on the sidewall of the sacrificial grid 16, and then the spacer material is etched to form the spacer 5. The gate material may be polycrystalline silicon. The spacer material may be $SiO_2$ or SiN.

Figure 9:
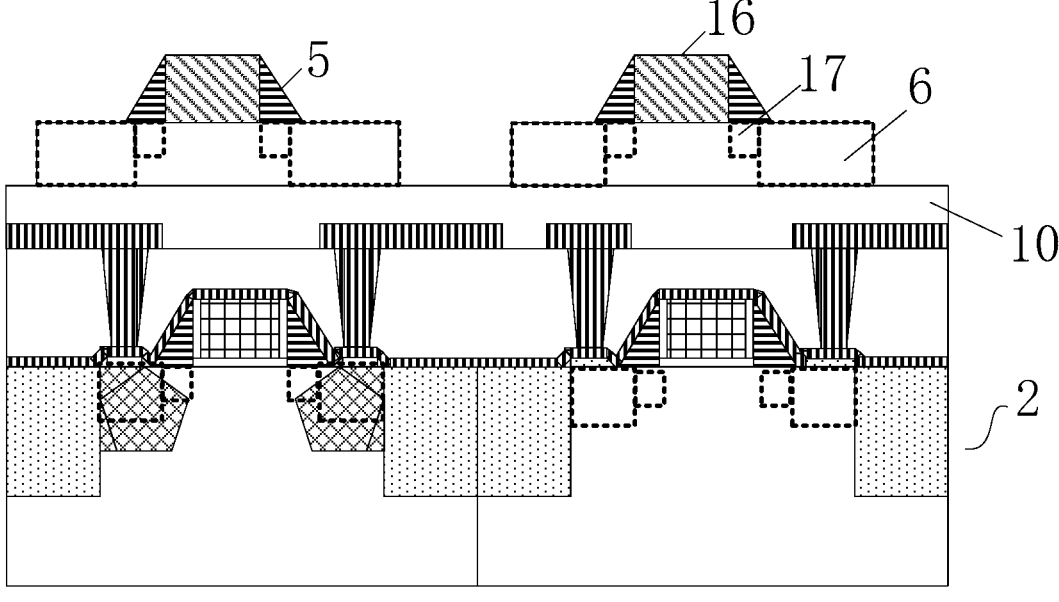

In step S33, the active regions 15 on the two sides of the sacrificial gate 16 are s subject to source-or-drain doping to form a source-or-drain region 6, as shown in FIG. 9.

The source-or-drain doping is performed through heavy doping in the active region 15 on the two sides of the sacrificial gate 16 by using impurities, or through fabricating fully siliconized metal in the active region 15 on the two sides of the sacrificial gate 16.

In step S34, the oxide dielectric layer 8 is deposited on the structure that has been formed, and the oxide dielectric layer 8 is subject to second planarization to expose a top of the sacrificial gate 16.

Figure 10:
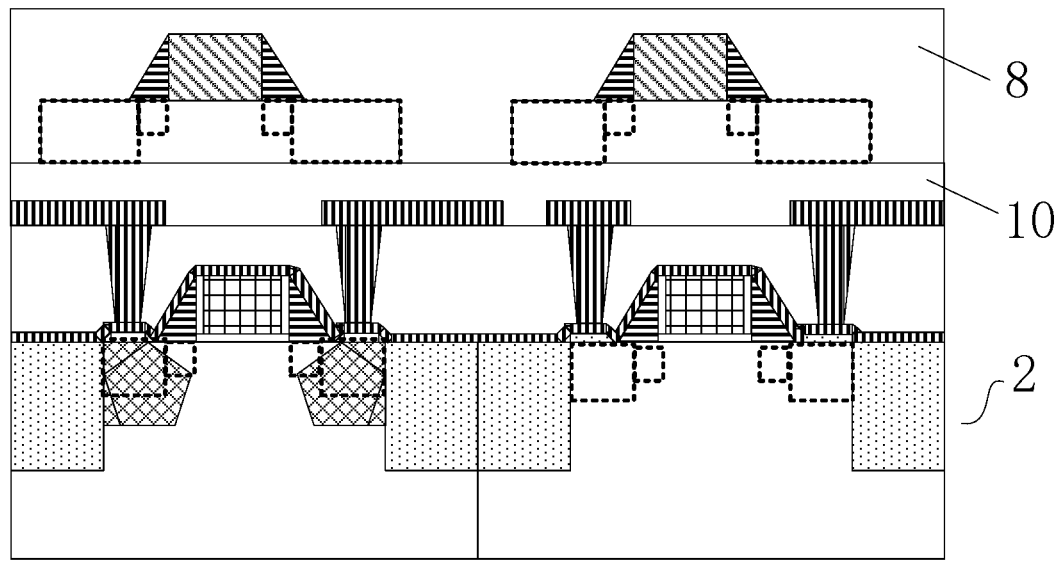

In this step, the oxide dielectric layer 8 is deposited on the formed structure as shown in FIG. 10. A thickness of the oxide dielectric layer 8 is sufficient to cover the protruding sacrificial gate 16. Then, the oxide dielectric layer 8 is subject to CMP or another process for the second planarization, such that the top of the sacrificial gate 16 is exposed to facilitate subsequent gate-replacement.

In step S35, the sacrificial gate is replaced by a gate structure, and a metal contact 9 is formed for the multiple first low-temperature MOS transistors 14.

Figure 11:
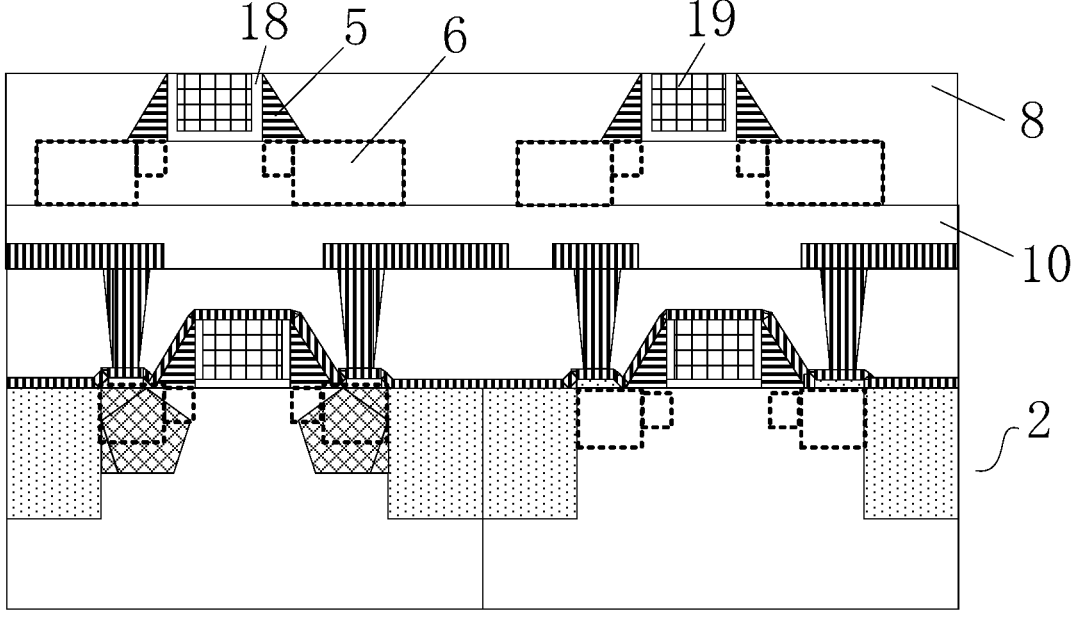
Figure 12:
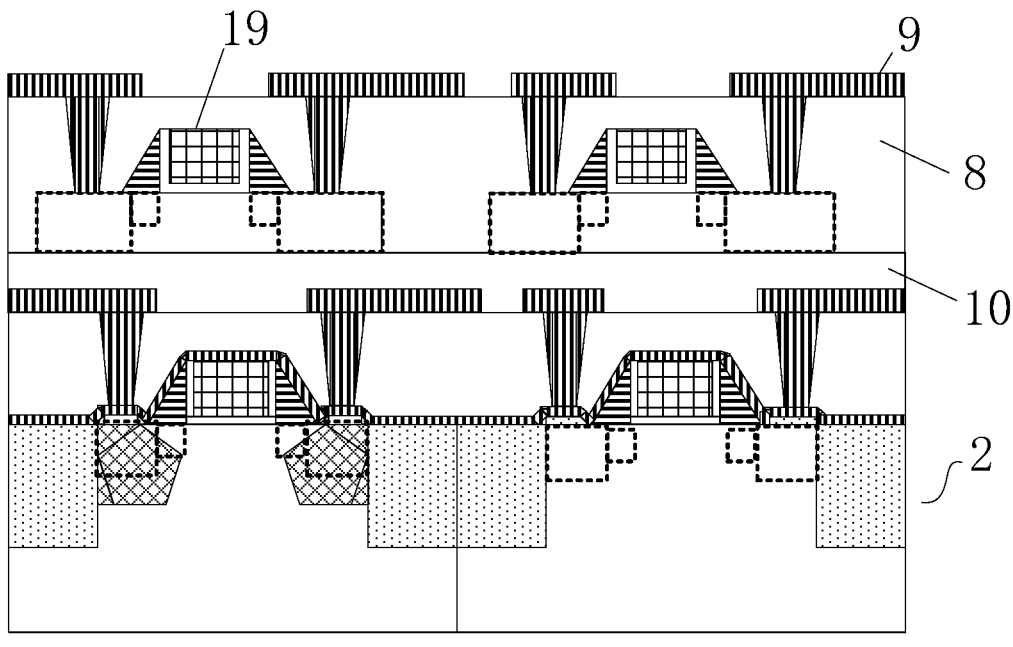

In this step, the sacrificial gate 16 in a gate region is removed, and a gate dielectric layer 18 and then a gate 19 are formed in the gate region, as shown in FIG. 11. After the gate 19 is formed, the oxide dielectric layer 8 is etched downward from its top to form a through-hole, as shown in FIG. 12. The through-hole is filled with metal to form the metal contact 9. A location of the through-hole corresponds to that of the source-or-drain region 6. The filing metal may be titanium, titanium nitride, aluminum, aluminum nitride, or a stack of the above.

Figure 13:
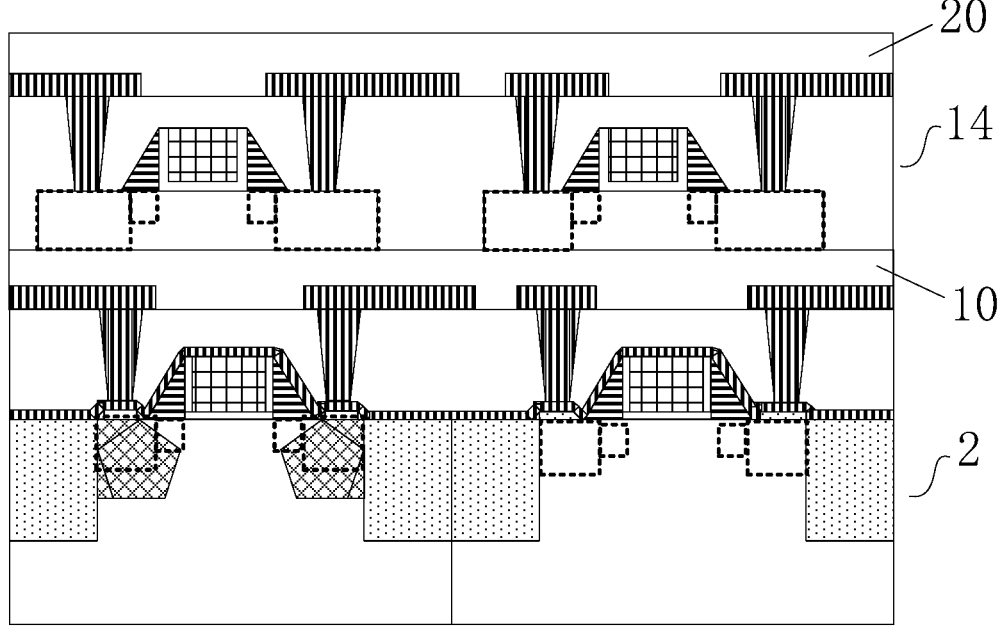

As shown in FIG. 13, the second insulating layer 20 should be formed on the multiple first low-temperature MOS transistors 14 after the multiple first low-temperature MOS transistors 14 are formed. A material and a thickness of the second insulating layer 20 may be same as those of the first insulating layer 10, or may be determined based on an actual condition.

In step S4, a second material layer is bonded to the second insulating layer 20, and then the second material layer is subject to second thinning and second surface processing, so as to form a second substrate layer.

Figure 14:
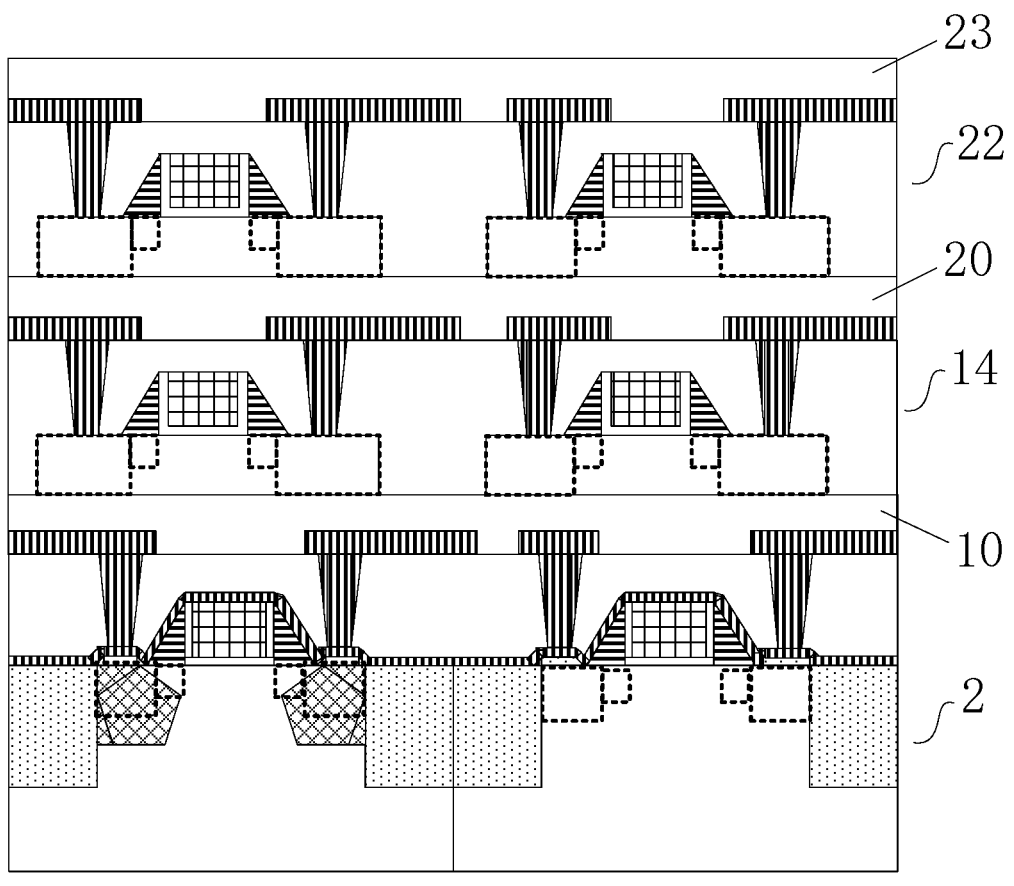

In step S5, multiple second low-temperature MOS transistors 22 are manufactured at a low temperature on the second substrate layer, and a third insulating layer 23 is formed on the multiple second low-temperature MOS transistors 22, so as to form a third semiconductor structure 21. Reference is made to FIG. 14.

Operations in the step S4 are substantially identical to those in the step S2, and operations in the step S5 are substantially identical to those in the step S3. Hence, they are not repeated herein.

In the method according to embodiments of the present disclosure, the second semiconductor structure 13 and the third semiconductor structure 21 are sequentially formed on the first semiconductor structure 1 through operations described in the steps S2 to S5. It is appreciated that the above operations may be repeated based on an actual condition to fabricate an N-th semiconductor structure, where N is greater than or equal to 1.

In an embodiment, the first low-temperature MOS transistor 14 and the second low-temperature MOS transistor 22 are manufactured at a low temperature T, where 0<T<500° C. That is, the first low-temperature MOS transistor 14 and the second low-temperature MOS transistor 22 meeting an operation requirement are manufactured under a temperature range corresponding to the forgoing T.

In an embodiment, each of the second insulating layer 20 and the third insulating layer 23 is made of SiO$_2$, Si$_3$N$_4$ or SiN, and has a thickness ranging from 300 nm to 3 μm.

Figure 15:
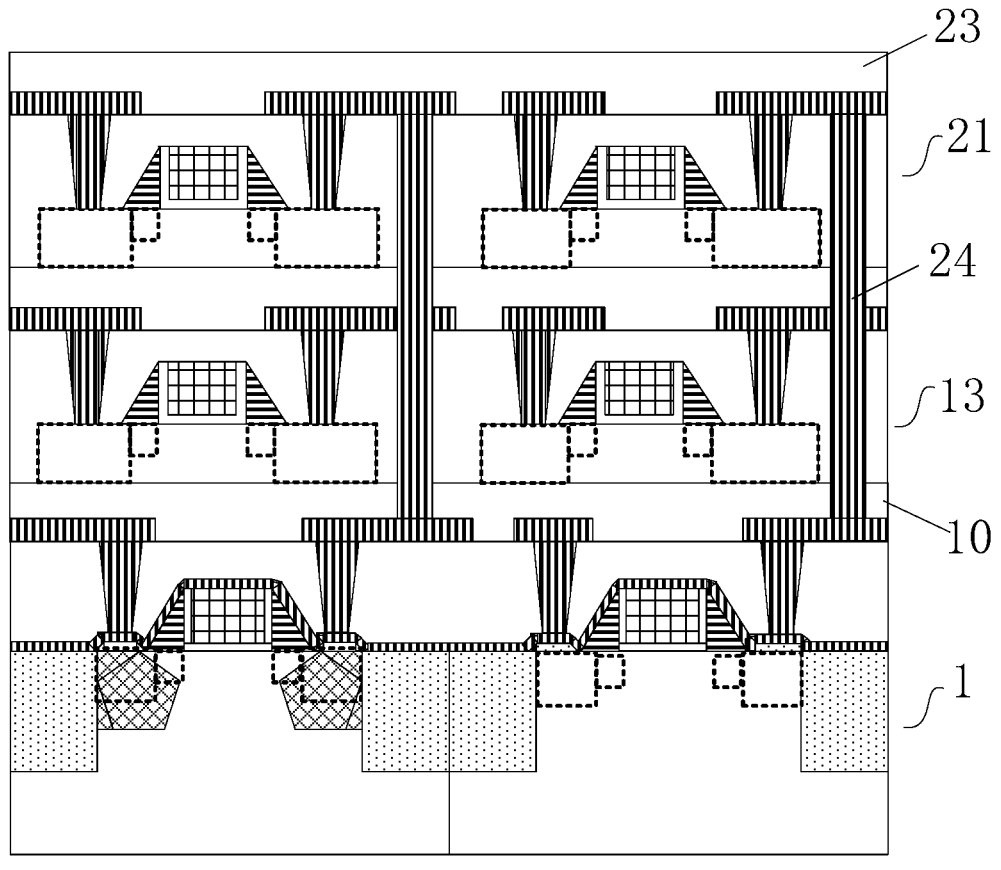

In step S6, a through-hole is provided in the first insulating layer 10, the second semiconductor structure 13, and the third semiconductor structure 21, and a metal is deposited in the through-hole, so as to form an interconnection layer 24. Reference is made to FIG. 15. Thereby, the first semiconductor structure 1, the second semiconductor structure 13, and the third semiconductor structure 21 are interconnected.

In this step, the three semiconductor structures are required to be stereoscopically interconnected with each other after being sequentially formed. The through-hole is provided in the first insulating layer 10, the second semiconductor structure 13 and the third semiconductor structure 21. A position of the through-hole corresponds to the metal contacts 9 of the MOS transistor 2, of the first low-temperature MOS transistor, and of the second low-temperature MOS transistor. After the through-hole is formed, metal is filled in the through-hole to interconnect the first semiconductor structure 1, the second semiconductor structure 13, and the third semiconductor structure 21. Thereby, manufacturing of the three-dimensional SRAM is implemented.

A three-dimensional static random-access memory is further provided according to an embodiment of the present disclosure. As shown in FIG. 15, the three-dimensional static random-access memory includes a first semiconductor structure 1, a second semiconductor structure 13, a third semiconductor structure 21, and an interconnection layer 24.

The first semiconductor structure 1 includes multiple MOS transistors 2 and a first insulating layer 10 that is formed on the multiple MOS transistors 2.

The second semiconductor structure 13 includes multiple first low-temperature MOS transistors 14 and a second insulating layer 20 that is formed on the multiple first low-temperature MOS transistors 14.

The third semiconductor structure 21 includes multiple second low-temperature MOS transistors 22 and a third insulating layer 23 that is formed on the multiple second low-temperature MOS transistors 22.

The interconnection layer 24 extends along a vertical direction, is disposed in the first insulating layer 10, the second semiconductor structure 13, and the third semiconductor structure 21, and interconnects the first semiconductor structure 1, the second semiconductor structure 13, and the third semiconductor structure 21.

The multiple first low-temperature MOS transistors 14 are formed on the first insulating layer 10. A substrate of the multiple first low-temperature MOS transistors 14 is bonded to a side of the first insulating layer 10 away from the MOS transistor 2.

The multiple second low-temperature MOS transistors 22 are formed on the second insulating layer 20. A substrate of the multiple second low-temperature MOS transistors 22 is bonded with a side of the second insulating layer 20 away from the first low-temperature MOS transistor 14.

In the embodiment, the multiple MOS transistors 2 in the first semiconductor structure 1 correspond to driving components in a first layer of the SRAM. The multiple first low-temperature MOS transistors 14 correspond to load components in a second layer of the SRAM. The multiple second low-temperature 22 correspond to transmission components in a third layer of the SRAM.

According to the above technical solutions, mature techniques for manufacturing the MOS transistors 2 are combined with bonding techniques to bonding two layers of multiple low-temperature MOS transistors sequentially to the multiple MOS transistors 2. Thereby, a three-dimensional SRAM occupying a small area and of high quality is provided. A structure of the three-dimensional SRAM is less complex, and manufacture of the 3D SRAM is less difficult.

In an embodiment, the MOS transistor 2 is a CMOS transistor. The first low-temperature MOS transistor 14 and the second low-temperature MOS transistor 22 are low-temperature CMOS transistors.

According to the above technical solution, the CMOS transistor has low power consumption and great anti-interference capability, and is integration-friency, which facilitate manufacturing of the SRAM. The low-temperature CMOS has higher operation speed and higher reliability, and has a performance similar to a bipolar logic circuit when operating at a low voltage. The low-temperature CMOS facilitates a high degree of integration and a high packaging density, which further reduces the area occupied by the three-dimensional SRAM.

In an embodiment, each of the first insulating layer 10, the second insulating layer 20, and the third insulating layer 23 is made of SiO$_2$, Si$_3$N$_4$ or SiN, and has a thickness ranging from 300 nm to 3 μm.

In summary, the method for manufacturing the three-dimensional static random-access memory is provided according to embodiments of the present disclosure. The multiple MOS transistors 2 may be manufactured in a conventional manner, and the first insulating layer 10 is formed on the multiple MOS transistors 2 to form the first semiconductor structure 1. The first material layer 11 is bonded to the first insulating layer 10 to adhere the first insulating layer 10 with the first material layer 11 tightly. Then, the first material layer 11 is subject to thinning and surface processing. The multiple first low-temperature MOS transistors 14 are fabricated at the low temperature on the first material layer 11, and the second insulating layer 20 is formed on the multiple first low-temperature MOS transistors 14 to form the second semiconductor structure 13. The above operations of forming the second semiconductor structure 13 are repeated to form the third semiconductor structure 21, and the interconnection layer 24 is formed. Hence, manufacture of the three-dimensitonal SRAM is implemented.

In comparison with conventional technology, the method provided herein is capable to manufacture the three-dimensitonal SRAM combining a manner, which is conventional and mature for manufacturing MOS transistors 2 or low-temperature MOS transistors, and bonding techniques. An area occupied by SRAMs is reduced while guaranteeing quality of the SRAMs.

Similarly, the three-dimensional SRAM according to embodiments of the present disclosure has the advantages of small occupation area and high quality Hereinabove described are merely preferable embodiments of the present disclosure, which are not intended to limit the present disclosure. Those skilled in the art may made various modifications and variations based on the present disclosure. Any modification, equivalent substitution, or improvement made within the spirit and the principle of the present disclosure shall fall within the protection scope of the present disclosure.

The invention claimed is:

1. A method for manufacturing a three-dimensional static random-access memory, comprising:

forming a first semiconductor structure, wherein the first semiconductor structure comprises a plurality of MOS transistors and a first insulating layer formed on the plurality of MOS transistors;

bonding a first material layer to the first insulating layer, and thinning the first material layer and processing a surface of the thinned first material layer to form a first substrate layer;

forming a second semiconductor structure on the first substrate layer, wherein the second semiconductor structure comprises a plurality of first MOS transistors on the first substrate layer and a second insulating layer on the plurality of first MOS transistors, and the plurality of first MOS transistors is formed at a first temperature;

bonding a second material layer to the second insulating layer, and thinning the second material layer and processing a surface of the thinned second material layer to form a second substrate layer;

forming a third semiconductor structure on the second substrate layer, wherein the third semiconductor structure comprises a plurality of second MOS transistors on the second substrate layer and a third insulating layer on the plurality of second MOS transistors, and the plurality of second MOS is formed at a second temperature;

forming a through-hole within the first insulating layer, the second semiconductor structure, and the third semiconductor structure;

depositing metal in the through-hole to form an interconnection layer which interconnects the first semiconductor structure, the second semiconductor structure and the third semiconductor structure;

wherein the first semiconductor structure comprises a first layer of metal contact located at an interface between the first insulating layer and the plurality of MOS transistors, the second semiconductor structure comprises a second layer of metal contact located at an interface between the second insulating layer and the plurality of first MOS transistors, the third semiconductor structure comprises a third layer of metal contact located at an interface between the third insulating layer and the plurality of second MOS transistors, and the interconnection layer extends from the first layer of metal contact via the second layer of metal contact to the third layer of metal contact;

wherein the plurality of MOS transistors serves as driving components in a first layer of a SRAM, the plurality of first MOS transistors serves as load components in a second layer of the SRAM, and the plurality of second MOS transistors severs as transmission components in a third layer of the SRAM.

2. The method according to claim 1, wherein
the plurality of MOS transistors, the plurality of first MOS transistors, and the plurality of second MOS transistors are CMOS transistors;
the first temperature and the second temperature are lower than a temperature at which the plurality of MOS transistors are formed;
each of the first material layer and the second material layer is a monocrystalline silicon wafer, a monocrystalline germanium wafer, or a silicon-on-insulator substrate.

3. The method according to claim 1, wherein:
the first material layer is bonded to the first insulating layer through silicon-to-silicon direct bonding, metal surface bonding, polymer bonding, or eutectic bonding, and
the second material layer is bonded to the second insulating layer through silicon-to-silicon direct bonding, metal surface bonding, polymer bonding, or eutectic bonding.

4. The method according to claim 3, wherein bonding the first material layer to the first insulating layer through the silicon-to-silicon direct bonding process comprises:
planarizing a surface of the first insulating layer;
rinsing the planarized surface of the first insulating layer, wherein a monolayer of water molecules is retained on the planarized surface of the first insulating layer after the rinsing;
oxidizing a surface of the first material layer to form an oxidation surface;
disposing the first material layer on the rinsed surface of the first insulating layer, wherein the oxidation surface is in contact with the rinsed surface of the first insulating layer;
bonding the oxidation surface to the rinsed surface of the first insulating layer in a face-to-face manner; and
annealing the first material layer and the first insulating layer after the bonding.

5. The method according to claim 4, wherein after oxidizing the surface of the first material layer and before disposing the first material layer on the rinsed surface of the first insulating layer, the method further comprises:
performing plasma activation on the oxidation surface and the rinsed surface of the first insulating layer.

6. The method according to claim 4, wherein bonding the oxidation surface to the rinsed surface of the first insulating layer in the face-to-face manner comprises:
pressing the oxidation surface of the first material layer against the rinsed surface of the first insulating layer under a mechanical pressure.

7. The method according to claim 1, wherein each of the first insulating layer, the second insulating layer, and the third insulating layer is made of $SiO_2$, $Si_3N_4$ or SiN, and has a thickness ranging from 300 nm to 3 $\mu m$.

8. The method according to claim 1, wherein the first temperature and the second temperature are greater than 0° C. and lower than 500° C.

9. The method according to claim 1, wherein manufacturing one of the plurality of first MOS transistors comprises:
forming an active region on the first substrate layer;
manufacturing a sacrificial gate in the active region;
doping the active region at two sides of the sacrificial gate to form source-or-drain extending regions; and
forming a spacer at a sidewall of the sacrificial gate, wherein the spacer covers at least a part of the source-or-drain extending regions;
doping the active region at a side of the source-or-drain extending regions away from the source-or-drain extending regions to form source-or-drain regions;
depositing an oxide dielectric layer on the sacrificial gate, the spacer, and the source-or-drain regions;
planarizing the oxide dielectric layer to expose a top of the sacrificial gate;
replacing the exposed sacrificial gate with a gate structure; and
forming a plurality of metal contacts for the one of the plurality of first MOS transistors.

10. The method according to claim 9, wherein doping the source-or-drain extending regions comprises;

doping the source-or-drain extending regions with impurities; or forming fully siliconized metal at the source-or-drain extending regions.

11. A three-dimensional static random-access memory, comprising:

a first semiconductor structure, wherein the first semiconductor structure comprises a plurality of MOS transistors and a first insulating layer that is formed on the plurality of MOS transistors;

a second semiconductor structure, wherein the second semiconductor structure comprises a plurality of first MOS transistors and a second insulating layer that is formed on the plurality of first MOS transistors;

a third semiconductor structure, wherein the third semiconductor structure comprises a plurality of second MOS transistors and a third insulating layer that is formed on the plurality of second MOS transistors; and an interconnection layer extending vertically within the first insulating layer, the second semiconductor structure, and the third semiconductor structure, wherein the interconnection layer is configured to interconnect the first semiconductor structure, the second semiconductor structure, and the third semiconductor structure;

wherein the plurality of first MOS transistors is formed on the first insulating layer, and a substrate of the plurality of first MOS transistors is bonded to a side of the first insulating layer away from the plurality of MOS transistors;

wherein the plurality of second MOS transistors is formed on the second insulating layer, and a substrate of the plurality of second MOS transistors is bonded to a side of the second insulating layer away from the plurality of first MOS transistors; and wherein the first semiconductor structure comprises a first layer of metal contact located at an interface between the first insulating layer and the plurality of MOS transistors, the second semiconductor structure comprises a second layer of metal contact located at an interface between the second insulating layer and the plurality of first MOS transistors, the third semiconductor structure comprises a third layer of metal contact located at an interface between the third insulating layer and the plurality of second MOS transistors, and the interconnection layer extends from the first layer of metal contact via the second layer of metal contact to the third layer of metal contact;

wherein the plurality of MOS transistors serves as driving components in a first layer of a SRAM, the plurality of first MOS transistors serves as load components in a second layer of the SRAM, and the plurality of second MOS transistors severs as transmission components in a third layer of the SRAM.

12. The three-dimensional static random-access memory according to claim 11, wherein:

the plurality of MOS transistors, the plurality of first MOS transistors, and the plurality of second MOS transistors are CMOS transistors.

13. The three-dimensional static random-access memory according to claim 11, wherein:

each of the first insulating layer, the second insulating layer, and the third insulating layer is made of $SiO_2$, $Si_3N_4$ or SiN, and has a thickness ranging from 300 nm to 3 μm.

14. The method according to claim 11, wherein one of the plurality of first MOS transistors comprises: a gate structure; a spacer at two sides of the gate structure;

source-or-drain extending regions, wherein the source-or-drain extending regions are doped, and at least a part of the source-or-drain extending regions is located beneath the spacer;

source-or-drain regions, wherein the source- or drain regions are doped and located at a side of the source-or-drain extending regions away from the gate structure;

an oxide dielectric layer, covering the gate structure, the spacer, and the source-or-drain regions; and a plurality of metal contacts on the oxide dielectric layer.

* * * * *